US012675617B2

(12) United States Patent
Chen et al.

(10) Patent No.:     US 12,675,617 B2
(45) Date of Patent:          Jul. 7, 2026

(54) METHOD AND SYSTEM FOR AUTOMATICALLY GENERATING AND MANAGING ENGINEERING DRAWINGS OF CUSTOMIZED STAMPING PRESS MACHINE

(71) Applicant: METAL INDUSTRIES RESEARCH & DEVELOPMENT CENTRE, Kaohsiung (TW)

(72) Inventors: Pin-Jyun Chen, Kaohsiung City (TW); Ming Fang Tsai, Yunlin County (TW); Hui-Chi Chang, Kaohsiung City (TW)

(73) Assignee: METAL INDUSTRIES RESEARCH & DEVELOPMENT CENTRE, Kaohsiung (TW)

( * ) Notice: Subject to any disclaimer, the term of this patent is extended or adjusted under 35 U.S.C. 154(b) by 863 days.

(21) Appl. No.: 18/146,387

(22) Filed: Dec. 26, 2022

(65) Prior Publication Data

US 2024/0211650 A1     Jun. 27, 2024

(51) Int. Cl.
*G06F 30/17* (2020.01)

(52) U.S. Cl.
CPC .................................... *G06F 30/17* (2020.01)

(58) Field of Classification Search
CPC ........... G06F 30/00; G06F 30/17; G06F 30/10
(Continued)

(56) References Cited

U.S. PATENT DOCUMENTS

2003/0103083 A1*  6/2003  Denny .................... G06F 30/00
                                                                        715/771
2009/0063172 A1    3/2009  Thomas et al.
(Continued)

FOREIGN PATENT DOCUMENTS

CN     105069222 A    11/2015
CN     102855350 B    1/2016
(Continued)

OTHER PUBLICATIONS

Radhakrishnan, Raj et al. "Design Rule Checker for Sheet Metal Components Using Medial Axis Transformation and Geometric Reasoning", 1996, Journal of Manufacturing Systems, vol. 15, No. 3. (Year: 1996).*

*Primary Examiner* — Cedric Johnson
(74) *Attorney, Agent, or Firm* — CKC & Partners Co., LLC

(57)               ABSTRACT

Method for automatically generating and managing engineering drawings of customized stamping press machine includes following steps. Plural customized parameters are inputted and a stored location is selected through a parameter setting interface of engineering drawings. Assembly file of stamping press machine and plural part files corresponding to plural parts composed of the assembly file are read. Recognition process is performed on each part according to the customized parameters and a customized design rule base of the stamping press machine, thereby determining whether the parts contain plural customized parts that need to regenerate the engineering drawings. CAD software is called to automatically generate plural customized part files corresponding to the customized parts. The CAD software is called to automatically generate plural customized engineering drawings, a customized assembly file and a part list according to the customized parts files. Aforementioned automatically generated results are stored in the stored location.

15 Claims, 3 Drawing Sheets

(58) Field of Classification Search
    USPC ......................................................... 703/7, 6
    See application file for complete search history.

(56)                    References Cited

U.S. PATENT DOCUMENTS

| 2017/0297076 A1 | 10/2017 | Watanabe et al. |
| 2019/0179291 A1 | 6/2019 | Olsson |

FOREIGN PATENT DOCUMENTS

| CN | 112001002 A | * | 11/2020 | ............ G06F 30/10 |
| CN | 115292848 A | | 11/2022 | |
| JP | 2005329468 A | * | 12/2005 | |
| TW | 200821786 A | | 5/2008 | |
| TW | 1309791 B | * | 5/2009 | |
| TW | 202020072 A | | 6/2020 | |
| TW | 718723 B | | 2/2021 | |

* cited by examiner

METHOD AND SYSTEM FOR AUTOMATICALLY GENERATING AND MANAGING ENGINEERING DRAWINGS OF CUSTOMIZED STAMPING PRESS MACHINE

BACKGROUND

Field of Invention

The present invention relates to an automatically generating and managing method. More particularly, the present invention relates to method and system for automatically generating and managing engineering drawings of customized stamping press machine.

Description of Related Art

At present, the stamping press equipment industry relies on a large amount of manpower to carry out work related to the modification of fixed designs. In the development of the stamping press machine industry, in order to speed up the design and manufacture cycle of stamping press machine, a large number of computer-aided design (CAD) software is relied on to assist in the design of stamping press machine, but the drawing work still relies on engineers to manually operate. And thus, when customized stamping press machine is developed, a lot of manpower and time are consumed for drawing work.

SUMMARY

The present invention provides a method for automatically generating and managing engineering drawings of customized stamping press machine. The method includes steps of: inputting plural customized parameters and selecting a stored location through a parameter setting interface of engineering drawings; reading an assembly file of a stamping press machine and reading plural part files respectively corresponding to plural parts composed of the assembly file; performing a recognition process on each of the parts according to the customized parameters and a customized design rule base of the stamping press machine, thereby determining whether the parts contain plural customized parts that need to regenerate the engineering drawings; calling a CAD software to automatically generate plural customized part files respectively corresponding to the customized parts; calling the CAD software to automatically generate plural customized engineering drawings respectively corresponding to the customized parts according to the customized part files; calling the CAD software to automatically generate a customized assembly file and a part list according to the customized parts files; and storing the customized parts files, the customized engineering drawings, the customized assembly file and the part list in the stored location.

In accordance with one or more embodiments of the invention, the recognition process includes: reading a part name of each of the parts; determining whether one of the parts belongs to a standard product or a common part of the stamping press machine according to the part name of the one of the parts; determining whether the one of the parts needs to regenerate the engineering drawings according to the customized parameters and a customized part design rule of the customized design rule base when determining that the one of the parts does not belong to the standard product or the common part; and determining that the one of the parts is one of the customized parts when determining that the one of the parts needs to regenerate the engineering drawings.

In accordance with one or more embodiments of the invention, the recognition process further includes: determining whether the one of the parts belongs to the standard product according to a stand product category list of the customized design rule base; and determining whether the one of the parts belongs to the common part according to a common part category list of the customized design rule base.

In accordance with one or more embodiments of the invention, the recognition process further includes: ending the recognition process of the one of the parts when determining that the one of the parts belongs to the standard product or the common part; and ending the recognition process of the one of the parts when determining that the one of the parts does not need to regenerate the engineering drawings.

In accordance with one or more embodiments of the invention, the method further includes: establishing a file name of each of the customized parts files and the customized engineering drawings, thereby managing at least one of a version, a drawing title, a drawing number, a generated date and a generated time of each of the customized parts files and the customized engineering drawings.

In accordance with one or more embodiments of the invention, the customized parameters includes at least one of a machine type selection, a working tonnage, a table size, a mold clamping height, a machine quantity, a machine number and a designer name.

In accordance with one or more embodiments of the invention, the CAD software is SolidEdge, Inventor, SolidWorks, or other CAD software with a secondary development function library.

In accordance with one or more embodiments of the invention, the CAD software is called by directly calling or indirectly calling a secondary development function library of the CAD software.

In accordance with one or more embodiments of the invention, the parameter setting interface includes at least one of a graphic data interface, a text data interface and a digit data interface.

The present invention further provides a system for automatically generating and managing engineering drawings of customized stamping press machine. The system includes a computer server and an electronic device communicatively connected to the computer server. The electronic device includes a parameter setting interface of engineering drawings, a memory for storing instructions, and a processor connected to the memory. The processor executes the instructions to perform steps of: inputting plural customized parameters and selecting a stored location of the computer server through a parameter setting interface; reading an assembly file of a stamping press machine and reading plural part files respectively corresponding to plural parts composed of the assembly file from the computer server; performing a recognition process on each of the parts according to the customized parameters and a customized design rule base of the stamping press machine, thereby determining whether the parts contain plural customized parts that need to regenerate the engineering drawings; calling a CAD software to automatically generate plural customized part files respectively corresponding to the customized parts; calling the CAD software to automatically generate plural customized engineering drawings respectively corresponding to the customized parts according to the customized part files; calling the CAD software to automatically generate a customized assembly file and a part list according to the customized parts files; and transmitting the customized parts files, the customized engineering drawings, the customized assembly file and the part list to the computer server, thereby storing the customized parts files, the customized engineering drawings, the customized assembly file and the part list in the stored location of the computer server.

In accordance with one or more embodiments of the invention, the processor further executes the instructions to perform steps of: establishing a file name of each of the customized parts files and the customized engineering drawings, thereby managing at least one of a version, a drawing title, a drawing number, a generated date and a generated time of each of the customized parts files and the customized engineering drawings.

In accordance with one or more embodiments of the invention, the customized parameters includes at least one of a machine type selection, a working tonnage, a table size, a mold clamping height, a machine quantity, a machine number and a designer name.

In accordance with one or more embodiments of the invention, the CAD software is SolidEdge, Inventor, Solid-Works, or other CAD software with a secondary development function library.

In accordance with one or more embodiments of the invention, the CAD software is called by directly calling or indirectly calling a secondary development function library of the CAD software.

In accordance with one or more embodiments of the invention, the parameter setting interface includes at least one of a graphic data interface, a text data interface and a digit data interface.

In order to let above mention of the present invention and other objects, features, advantages, and embodiments of the present invention to be more easily understood, the description of the accompanying drawing as follows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Specific embodiments of the present invention are further described in detail below with reference to the accompanying drawings, however, the embodiments described are not intended to limit the present invention and it is not intended for the description of operation to limit the order of implementation.

Figure 1:
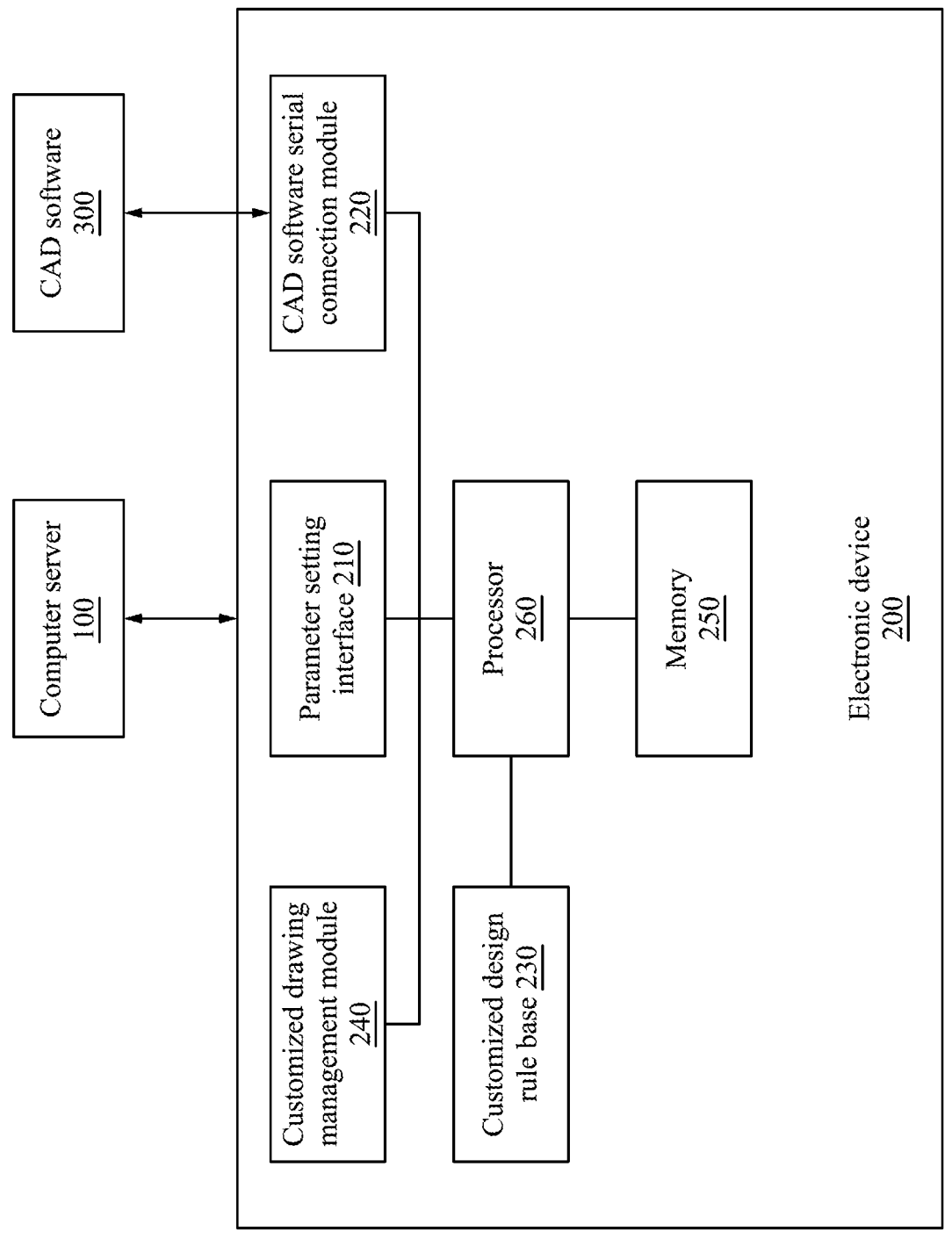
FIG. 1 illustrates a system for automatically generating and managing engineering drawings of customized stamping press machine according to some embodiments of the present invention.

FIG. 1 illustrates a system for automatically generating and managing engineering drawings of customized stamping press machine according to some embodiments of the present invention. As shown in FIG. 1, the system for automatically generating and managing engineering drawings of customized stamping press machine includes a computer server 100, an electronic device 200 communicatively connected to the computer server 100, and a computer-aided design (CAD) software 300 communicatively connected to the electronic device 200. The electronic device 200 includes a parameter setting interface 210 of the engineering drawings, a CAD software serial connection module 220, a customized design rule base 230 of a stamping press machine, a customized drawing management module 240, a memory 250, and a processor 260. The parameter setting interface 210, the CAD software serial connection module 220, the customized design rule base 230, the customized drawing management module 240, and the memory 250 are communicatively connected to the processor 260. The CAD software serial connection module 220 is communicatively connected to the CAD software 300. The parameter setting interface 210, the customized design rule base 230, the customized drawing management module 240, and the processor 260 are communicatively connected to the computer server 100 (not shown).

Figure 2:
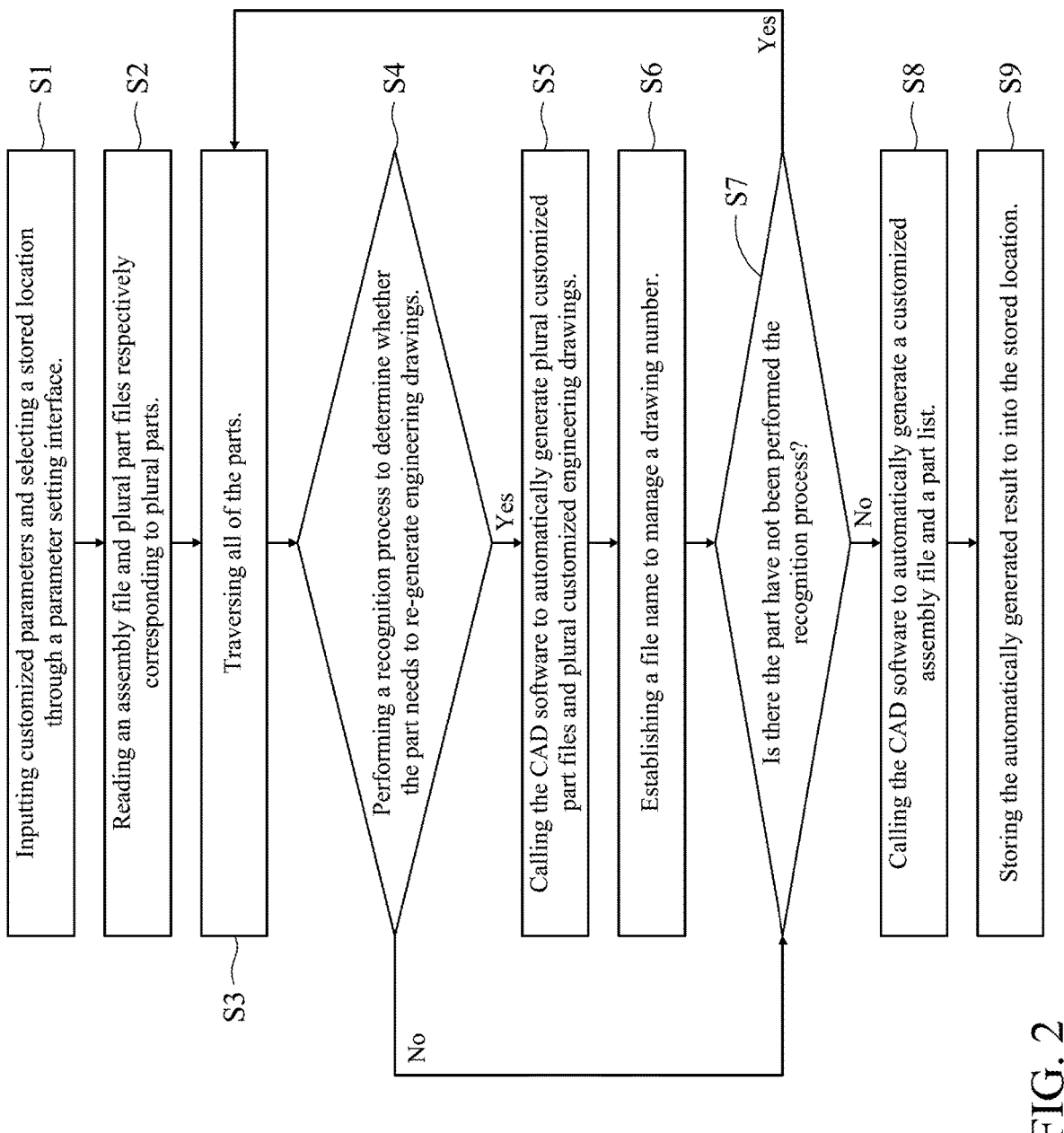
FIG. 2 illustrates a flowchart of a method for automatically generating and managing engineering drawings of customized stamping press machine according to some embodiments of the present invention.

FIG. 2 illustrates a flowchart of a method for automatically generating and managing engineering drawings of customized stamping press machine according to some embodiments of the present invention. As shown in FIG. 2, the method for automatically generating and managing engineering drawings of customized stamping press machine includes steps S1-S8. The memory stores plural instructions. The processor 260 is used to execute the instructions to perform the method for automatically generating and managing engineering drawings of customized stamping press machine, as shown in FIG. 2.

As shown in FIG. 1 and FIG. 2, in step S1, plural customized parameters are inputted and a stored location is selected through the parameter setting interface 210 of the engineering drawings. In some embodiments of the present invention, the parameter setting interface 210 is a graphic data interface, a text data interface, a digit data interface, or a combination thereof. Specifically, the parameter setting interface 210 has plural fields for the user to input plural customized parameters and select (or input) a file location of the computer server 100, and thus the parameter setting interface 210 can provide an interface for the user to set drawing parameters of the engineering drawings.

In some embodiments of the present invention, the aforementioned customized parameters includes at least one of: equipment specifications (a machine type selection, a working tonnage, a preset table, a table size, a mold clamping height, a machine quantity and/or a machine number), a customer name, a designer/drawer name, a production quantity, an order number, an ERP (Enterprise Resource Planning) code, but the above parameters are only examples, and the present invention is not limited thereto.

As shown in FIG. 1 and FIG. 2, in step S2, an assembly file of the stamping press machine and plural part files respectively corresponding to plural parts composed of the assembly file are read from a preset path of the computer server 100. Specifically, the assembly file and the part files which are read from the preset path of the computer server 100 are system default sample files.

As shown in FIG. 1 and FIG. 2, in step S3, all of the parts are traversed. Then, in step S4, a recognition process is performed on the single part according to the customized design rule base 230 and the customized parameters inputted at step S1, thereby determining whether the single part is a customized part that needs to regenerate the engineering drawings. If the determination result of step S4 is yes, the step S5 is performed. If the determination result of step S4 is no, the step S7 is performed. In other words, the step S3 and the step S4 perform the recognition process on each of the parts according to the customized design rule base 230 and the customized parameters, thereby determining whether the parts contain plural customized parts that need to regenerate the engineering drawings.

Figure 3:
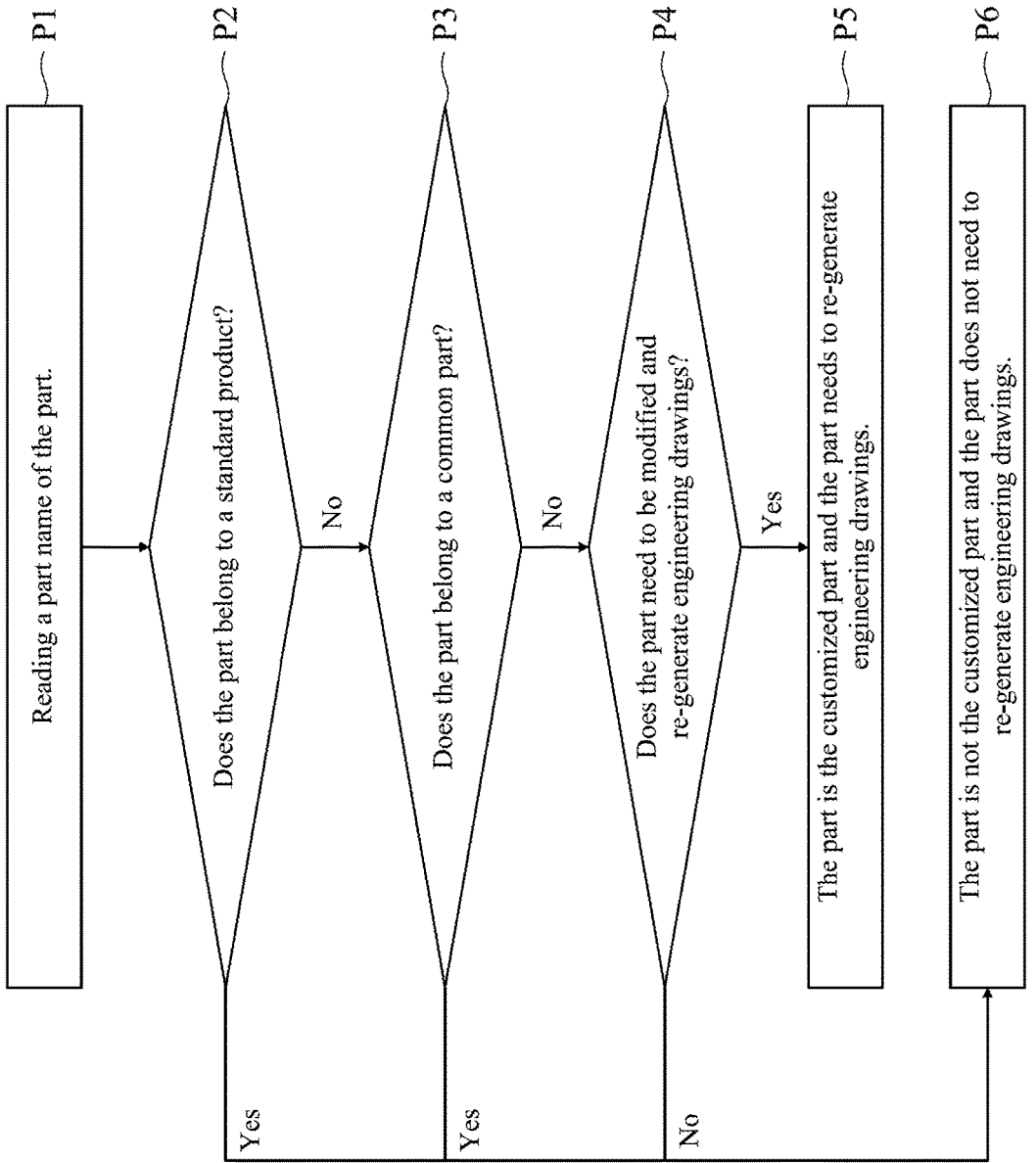
FIG. 3 illustrates a flowchart of the recognition process at a specific step according to some embodiments of the present invention.

FIG. 3 illustrates a flowchart of the recognition process at step S4 according to some embodiments of the present invention. As shown in FIG. 3, the recognition process includes steps P1-P6. In step P1, a part name of the single part is read. For example, the part name (such as upper seat, a lower seat, a slider, a workbench, etc.) of the single part can be obtained from the file name of the part file corresponding to the single part.

In step P2, it is determined whether the single part belongs to a standard product of the stamping press machine according to the part name of the single part. Specifically, the step P2 determines whether the single part belongs to the standard product (such as a motor, a hydraulic cylinder, etc.) of the stamping press machine according to a stand product category list (stored in the computer server 100) of the customized design rule base 230. That is, the step P2 determines whether the part name of the single part belongs into the stand product category list.

In step P3, it is determined whether the single part belongs to a common part of the stamping press machine according to the part name of the single part. Specifically, the step P3 determines whether the single part belongs to the common part (such as a human-machine console, a ball seat, etc.) of the stamping press machine according to a common part category list (stored in the computer server 100) of the customized design rule base 230. That is, the step P3 determines whether the part name of the single part belongs into the common part category list.

In step P4, when determining that the single part does not belong to the standard product or the common part, it is determined whether the single part needs to be modified and regenerate the engineering drawings according to the customized parameters inputted at step S1 and a customized part design rule of the customized design rule base 230. For example, when the table size of the customized parameters of the single part is not the default system value and the single part is not belongs to the standard product and the common part, such as a slider, a table plate, an upper seat, a lower seat, etc., the said single part needs to be modified its size and its hole locations.

In step P5, when determining that the single part needs to be modified and regenerate the engineering drawings, it is determined that the single part is the customized part, and the single part needs to regenerate the engineering drawings.

In step P6, when determining that the single part belongs to the standard product or the common part, it is determined that the single part is not the customized part, and the single part does not need to regenerate the engineering drawings. When it is determined that the single part does not need to regenerate the engineering drawings, it is determined that the single part is not the customized part.

As shown in FIG. 1 and FIG. 2, in step S5, the CAD software 300 is called, through the CAD software serial connection module 220, to automatically generate plural customized part files respectively corresponding to the customized parts, and then the CAD software 300 is called again, through the CAD software serial connection module 220, to automatically generate plural customized engineering drawings respectively corresponding to the customized parts.

In some embodiments of the present invention, the CAD software 300 is, for example, SolidEdge, Inventor, SolidWorks, or other CAD software with a secondary development function library (drawing function library). In some embodiments of the present invention, the CAD software 300 is called by directly calling or indirectly calling the secondary development function library (drawing function library) of the CAD software 300.

Specifically, the step S5 is to import the part file of the part that is determined to need to be modified and regenerate the engineering drawings in the recognition process at step S4 into the part sample file (stored in the computer server 100), and the step S5 is to call the secondary development function library (drawing function library) of the CAD software 300 to automatically generate the customized part file, and then the step S5 is to import the engineering drawing file of the part that is determined to need to be modified and regenerate the engineering drawings in the recognition process at step S4 into the engineering drawing sample file (stored in the computer server 100), and the step S5 is to call the secondary development function library (drawing function library) of the CAD software 300 to automatically generate customized engineering drawings (including three views of the corresponding part and their dimensions labeled thereon).

As shown in FIG. 1 and FIG. 2, in step S6, the customized drawing management module 240 establishes a file name of each of the customized parts files and the customized engineering drawings respectively corresponding to the customized parts files, thereby managing at least one of a version, a drawing title, a drawing number, a generated date and/or a generated time of each of the customized parts files and the customized engineering drawings respectively corresponding to the customized parts files. For example, the file name may include the drawing title, the part name, the drawing number, the generated date, but the present invention is not limited thereto. For example, the version, the drawing title, the drawing number, the generated date and/or the generated time are recorded in the customized engineering drawing, but the present invention is not limited thereto. Specifically, the customized drawing management module 240 is used to implement version management, so that drawing personnel can view and maintain.

As shown in FIG. 1 and FIG. 2, in step S7, checking whether there are parts that have not been performed for the recognition process. If the checking result of step S7 is yes, the step S3 is performed. If the checking result of step S7 is no, the step S8 is performed.

In step S8, the CAD software 300 is called, through the CAD software serial connection module 220, to automatically regenerate a customized assembly file and a part list according to the customized parts files. Specifically, the step S8 is to import the customized part files and the customized engineering drawings that are determined as the parts that need to be modified and regenerated engineering drawings in the recognition process into the assembly sample files (stored in the computer server 100), and the step S8 is to call the secondary development function library (drawing function library) of the CAD software 300 to automatically generate the customized assembly file and the part list.

In some embodiments of the present invention, the method for automatically generating and managing engineering drawings of customized stamping press machine further includes: establishing a file name of each of the customized assembly file and the part list (not shown), through the customized drawing management module 240, so as to manage the version, the drawing title, the drawing number, the generated date and/or the generated time of each of the customized assembly file and the part list. Specifically, the customized drawing management module 240 is used to implement version management, so that drawing personnel can view and maintain.

As shown in FIG. 1 and FIG. 2, in step S9, the customized parts files, the customized engineering drawings, the customized assembly file and the part list are transmitted, through the customized drawing management module 240, to the computer server 100, thereby storing the customized parts files, the customized engineering drawings, the customized assembly file and the part list in the stored location of the computer server 100, so that drawing personnel can view and maintain. Specifically, the stored location of the computer server 100 that is selected at step S1 is a file path that the customized parts files, the customized engineering drawings, the customized assembly file and the part list are stored in the computer server 100, and step S9 is to store the customized parts files, the customized engineering drawings, the customized assembly file and the part list in the stored location of the computer server 100.

To sum up, the present invention combines the customized drawing operation process of the stamping press machine with the drawing function library of the CAD software, and integrates the professional knowledge of the stamping press development engineer, and computer automation technology into the present invention to develop customized stamping press automatic drawing system to avoid tedious drawing work during the development of customized stamping press equipment, and to reduce human errors, and to speed up equipment development efficiency. Through the automatic engineering drawing generation technology of the present invention, the development time of stamping press equipment is shortened. For the most cumbersome engineering drawings that require a lot of manual modification operations, such as drawing of customized drawings and file management, standardization and automatic processing of corresponding software is implemented, and thus it can enhance manufacturers' focus on research, development and design, thereby promoting the international competitiveness of manufacturers.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for automatically generating and managing engineering drawings of customized stamping press machine, comprising:

inputting a plurality of customized parameters and selecting a stored location through a parameter setting interface of engineering drawings;

reading an assembly file of a stamping press machine and reading a plurality of part files respectively corresponding to a plurality of parts composed of the assembly file;

performing a recognition process on each of the parts according to the customized parameters and a customized design rule base of the stamping press machine, thereby determining whether the parts contain a plurality of customized parts that need to regenerate the engineering drawings;

calling a CAD software to automatically generate a plurality of customized part files respectively corresponding to the customized parts;

calling the CAD software to automatically generate a plurality of customized engineering drawings respectively corresponding to the customized parts according to the customized part files;

calling the CAD software to automatically generate a customized assembly file and a part list according to the customized parts files; and storing the customized parts files, the customized engineering drawings, the customized assembly file and the part list in the stored location.

2. The method of claim 1, wherein the recognition process comprises:

reading a part name of each of the parts;

determining whether one of the parts belongs to a standard product or a common part of the stamping press machine according to the part name of the one of the parts;

determining whether the one of the parts needs to regenerate the engineering drawings according to the customized parameters and a customized part design rule of the customized design rule base when determining that the one of the parts does not belong to the standard product or the common part; and determining that the one of the parts is one of the customized parts when determining that the one of the parts needs to regenerate the engineering drawings.

3. The method of claim 2, wherein the recognition process further comprises:

determining whether the one of the parts belongs to the standard product according to a stand product category list of the customized design rule base; and determining whether the one of the parts belongs to the common part according to a common part category list of the customized design rule base.

4. The method of claim 2, wherein the recognition process further comprises:

ending the recognition process of the one of the parts when determining that the one of the parts belongs to the standard product or the common part; and ending the recognition process of the one of the parts when determining that the one of the parts does not need to regenerate the engineering drawings.

5. The method of claim 1, further comprising:

establishing a file name of each of the customized parts files and the customized engineering drawings, thereby managing at least one of a version, a drawing title, a drawing number, a generated date and a generated time of each of the customized parts files and the customized engineering drawings.

6. The method of claim 1, wherein the customized parameters comprises at least one of a machine type selection, a working tonnage, a table size, a mold clamping height, a machine quantity, a machine number and a designer name.

7. The method of claim 1, wherein the CAD software is SolidEdge, Inventor, SolidWorks, or other CAD software with a secondary development function library.

8. The method of claim 1, wherein the CAD software is called by directly calling or indirectly calling a secondary development function library of the CAD software.

9. The method of claim 1, wherein the parameter setting interface comprises at least one of a graphic data interface, a text data interface and a digit data interface.

10. A system for automatically generating and managing engineering drawings of customized stamping press machine, comprising:

a computer server; and an electronic device communicatively connected to the computer server, wherein the electronic device comprises:

a parameter setting interface of engineering drawings;

a memory storing instructions; and a processor connected to the memory and executing the instructions to perform steps of:

inputting a plurality of customized parameters and selecting a stored location of the computer server through the parameter setting interface;

reading an assembly file of a stamping press machine and reading a plurality of part files respectively corresponding to a plurality of parts composed of the assembly file from the computer server;

performing a recognition process on each of the parts according to the customized parameters and a customized design rule base of the stamping press machine, thereby determining whether the parts contain a plurality of customized parts that need to regenerate the engineering drawings;

calling a CAD software to automatically generate a plurality of customized part files respectively corresponding to the customized parts;

calling the CAD software to automatically generate a plurality of customized engineering drawings respectively corresponding to the customized parts according to the customized part files;

calling the CAD software to automatically generate a customized assembly file and a part list according to the customized parts files; and transmitting the customized parts files, the customized engineering drawings, the customized assembly file and the part list to the computer server, thereby storing the customized parts files, the customized engineering drawings, the customized assembly file and the part list in the stored location of the computer server.

11. The system of claim 10, wherein the processor further executes the instructions to perform steps of:

establishing a file name of each of the customized parts files and the customized engineering drawings, thereby managing at least one of a version, a drawing title, a drawing number, a generated date and a generated time of each of the customized parts files and the customized engineering drawings.

12. The system of claim 10, wherein the customized parameters comprises at least one of a machine type selection, a working tonnage, a table size, a mold clamping height, a machine quantity, a machine number and a designer name.

13. The system of claim 10, wherein the CAD software is SolidEdge, Inventor, SolidWorks, or other CAD software with a secondary development function library.

14. The system of claim 10, wherein the CAD software is called by directly calling or indirectly calling a secondary development function library of the CAD software.

15. The system of claim 10, wherein the parameter setting interface comprises at least one of a graphic data interface, a text data interface and a digit data interface.

* * * * *